United States Patent
Yamazaki

(12)
(10) Patent No.: US 6,291,403 B1
(45) Date of Patent: Sep. 18, 2001

(54) METHOD OF MANUFACTURING SUPERCONDUCTING CERAMICS UNDER A MAGNETIC FIELD

(75) Inventor: Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 07/172,222

(22) Filed: Mar. 23, 1988

(30) Foreign Application Priority Data

Mar. 23, 1987 (JP) .................................................. 62-069447
Mar. 27, 1987 (JP) .................................................. 62-075205

(51) Int. Cl.⁷ .............................. C04B 35/64; H01L 39/12
(52) U.S. Cl. ...................... 505/400; 505/490; 505/727; 505/739; 505/822; 264/428; 264/434
(58) Field of Search .............................. 264/22, 24, 428, 264/434; 505/1, 727, 739, 400, 490, 822

(56) References Cited

U.S. PATENT DOCUMENTS

| 4,963,524 | 10/1990 | Yamazaki . | |
| 4,975,411 | 12/1990 | Danby et al. | .............................. 505/1 |
| 5,096,880 | * 3/1992 | Rybka | ........................................ 505/1 |

FOREIGN PATENT DOCUMENTS

| 5841795 | 3/1983 | (JP) . |
| 58217493 | 12/1983 | (JP) . |
| 60221392 | 11/1985 | (JP) . |

OTHER PUBLICATIONS

Brodsky et al, High–Temperature Superconductors, Symposium Held Nov. 30–Dec. 4, 1987, Boston, Mass., Materials Research Society, vol. 99.*
Patent Abstracts of Japan, vol. 7, No. 122 (C–168) (1267), May 26, 1983; & JP–A– 58 41 795 (Hitachi) Nov. 3, 1983 *abstract*.
Zietscherift Fuer Physik B—Condensed Matter, vo. 64, pp. 189–194, Springer–Verlag 1986; J.G. Bednorz, et al.: "Possible High Tc Superconductivity in the Ba–La–Cu–O System" *abstract*.
Patent Abstracts of Japan, vol. 10, No. 90 (C–337) (2147), Apr. 8, 1986; & JP–A–60 221 392 (Toshiba) Jun. 11, 1985 *abstract*.

* cited by examiner

*Primary Examiner*—James Derrington
(74) *Attorney, Agent, or Firm*—Nixon Peabody LLP; Jeffrey L. Costellia

(57) ABSTRACT

A high Tc superconducting ceramics material is produced by a method in which a mixture of chemicals in suitable amounts is compacted into a desired form. The compact mixture is then fired and, at the same time, a magnetic field is apilied to the compacted mixture in a predetermined direction. By virtue of the application of magnetic field during firing, the orderliness of molecular arrangement is enhanced and an elevated transition temperature Tc is obtained.

57 Claims, No Drawings

METHOD OF MANUFACTURING SUPERCONDUCTING CERAMICS UNDER A MAGNETIC FIELD

BACKGROUND OF THE INVENTION

This invention generally relates to the field of superconducting ceramics and particularly to manufacturing methods for making superconducting ceramics under a magnetic field.

It has long been known that metals such as mercury and lead, intermetallics such as NbNd, $Nb_3Ge$ and NbGa and ternary materials such as $Nb_3(Al_{0.8}Ge_{0.2})$ demonstrates superconductivity. However, the transition temperature of such long known conventional superconducting materials cannot exceed 25° K.

In more recent years, superconducting ceramics have attracted widespread interest. A new material was first reported by researchers at the Zurich laboratory of IBM Corp. as Ba—La—Cu—O-type high temperature superconducting oxides. Subsequently, La—Sr—Cu(II)-O-type superconducting oxides were also proposed. Another type of superconducting material that has been found is $(YBa_2)Cu_3O_{6-8}$. By virtue of the fact that these superconducting ceramics form a quasi-molecular atomic unit in a crystalline structure whose unit cell is constructed with one layer in which electrons have essentially one-dimensional motion, whereas three dimensional electron condition occurs in the long known materials mentioned above, higher transition temperatures were achieved.

Much work has been undertaken by researchers in the field who have endeavoured to elevate Tco, the temperature at which resistance vanishes, above the levels previously obtained and preferably above the boiling point of nitrogen (77° K) or even higher. As described in our European Patent Application No.87309081.5, we have investigated superconducting ceramic materials having the stoichiometric formulae $(A_{1-x}B_x)_yCu_zO_w$, where A represents one or more elements of Group IIIa of the Periodic Table, e.g., the rare earth elements, and B represents one or more elements of Group IIa of the Periodic Table, e.g. the alkaline earth elements including beryillium and magnesium, and in the continuation of these investigations we have disclosed that the existence of voids and grain boundaries in superconducting ceramic materials makes it difficult to obtain an elevated Tco.

OBJECTS AND SUMMARY OF THE INVENTION

It is therefore an object of the invention to provide superconducting ceramics having a higher transition temperature than hitherto and to manufacture superconducting ceramics substantially devoid of imperfection.

Whereas in previous attempts to find higher Tc superconducting materials attention has been focussed upon the composition or molar ratios of the constituent elements, in accordance with the present invention there is principally provided an improved process for the manufacture of superconducting ceramics in accordance with which, during the formation of superconducting structure, that is to say the chemical compounds which are mixed together to form the superconducting ceramics, a magnetic field is applied to thereto. The magnetic field is preferably applied in the direction normal to the (a,b) plane. The strength of the applied magnetic field is preferably not lower than 500 Gauss, e.g. 100,000 Gauss. By virtue of the magnetic field the ceramic mixture is given a special orientation in which the atomic arrangement is ordered and made more simple, e.g. on the (a,b) plane, so that few grain boundaries and imperfections exist in the final ceramic material. Accordingly, the higher transition temperature is obtained, and therefore the superconducting ceramics are endowed with a higher critical current. For example, the Tc onset is elevated to 50–107K and the critical current is elevated $10^5$ to $10^6$ $A/cm^2$ much higher than prior art has obtained on the order of $10^2$ $A/cm^2$. The fundamental concept of the present invention is based on the combination effect of the diamagnetism of superconductor and the current induced by the applied magnetic field.

Other feature of the invention are set forth with particularity in the appended claims and will become clear to those possessed of the relevant skills form consideration of the following description of exemplary embodiments.

DETAILED DESCRIPTION OF THE PREFERRED EMBODIMENT

Described hereinafter are a couple of examples illustrating the manufacture by a method according to the present invention of superconducting ceramics conforming to the stoichiometric formulae $(A_{1-x}B_x)_yCu_zO_w$, where A is one or more elements of Group IIIa of the Periodic Table, e.g., the rare earth elements, B is one or more elements of Group IIa of the Periodic Table, e.g., the alkaline earth metals including beryllium and magnesium, and x=0–1; y=2.0–4.0, preferably 2.5–3.5; z=1.0–4.0, preferably 1.5–3.5; and w=4.0–10.0, preferably 6.0–8.0.

EXAMPLE 1

Prescribed amounts of $BaCO_3$, CuO and $Y_2O_3$ (High Purity Chemical Industries Co. Ltd. 99.95% or higher) were used for preparing a superconducting ceramic material of the above formula where x=0.67, y=3, z=3 and w=6–9, i.e., in consistence with $(YBa_2)Cu_3O_{6-9}$. The factor "w" was controlled by adjusting the sintering condition.

After being mixed in a ball mill, the high purity chemicals were pressed in a capsule at 30 Kg/cm and formed into a cylindrical shaped tablet of 5 mm diameter and 15 mm height. The tablet was heated (fired) and oxidized at 500–1200° C., e.g., 700° C. for 8 hours in an oxdizing atmosphere such as in air, this step being called pre-firing hereinafter.

The tablet was subjected to a magnetic field during the pre-firing. The magnetic field is induced by an electromagnet whose North pole was positioned proximately to one end of the tablet and whose South pole was positioned proximately to the opposite end to subject the cylinderial tablet to a magnetic field in the axial direction. The strength of the applied magnetic field was 500 Gauss. The application of a stronger magnetic field is preferred if available.

Next, the tablet was finely ground in a ball mill so that average grain diameter was 200–0.03 microns, e.g., 10 microns or smaller. Then, the powder was pressed in a capsule at 50 Kg/cm to form a cylindrical tablet again.

The tablets were then fired, hereinafter called main-firing, for 10–50 hours at 500–1200° C., for example 15 hours at 900° C. in an oxidizing atmosphere such as in air. Then, the tablets were heated and reduced in an $O_2$ atmosphere with a 5–20 atom % Ar at 600–1200° C. for 3–30 hours, for example at 800° C. for 20 hours.

The tablets were subjected to a magnetic field during the main-firing and reduction in the same manner after the pre-firing for 10 unites or longer. The relationship between the temperature and the resistance was investigated, and as a result the highest Tc onset temperature and Tco were measured to be 101° K and 94° K respectively. The critical current densities were obtained to be as larger as $3\times10^5$ A/cm$^2$.

For reference, the manufacturing process was repeated again making no use of magnetic field. As a result, the Tc onset was 93° K and the Tc was 73° K.

EXAMPLE 2

The procedure of Example 1 was repeated but with 50% of Y substituted by Yb and with an alternating magnetic field of 50 Hz. The Yb was introduced as an oxide. As a result, Tc onset was measured to be 109° K and Tco was 93° K.

For reference, this manufacturing process was repeated again making no use of magnetic field. As a result, the Tc onset was 94 °K and the Tc was 81° K. Accordingly, Tc onset and Tc were elevated by 5–12° K respectively.

The foregoing Examples are merely illustrative of the invention, and do not include all of the combinations of elements and process variations which may be used to produce superconducting ceramic material in accordance with the invention, other combinations also being effective to provide improved superconducting materials.

Superconducting ceramics for use in accordance with the present invention also may be prepared in consistence with the stoichiometric formulae $(A_{1-x}B_x)_yCu_zO_w$, where A is one or more elements of Group Vb of the Periodic Table such as Bi, Sb and As, B is one or more elements of Group IIa of the Periodic Table, e.g., the alkaline earth metals including beryllium and magnesium, and x=0.3–1; y=2.0–4.0, preferably 2.5–3.5; z=1.0–4.0, preferably 1.5–3.5; and w=4.0–10.0, preferably 6.0–8.0, e.g. $BiCaSrCu_3O_{6-8}$.

While for several embodiments have been specifically described, it is to be appreciated that the present invention is not limited to the particular examples described and that modifications and variations can be made without departure from the scope of the invention as defined by the appended claims. For example, The tablet may be pressed in a die at 50 Kg/cm$^2$ during the main-firing. The constituent atoms are movable more easily at a higher temperature, so that the tablet becomes dense by this press. Hereinabove, superconducting ceramics are prepared in the form of tablets. However, after pre-firing or main-firing, the tablet may be ground to be powder, so that the ground material can be dispersed into solvent. The solution (or suspension) is applied to the surface of an object such as a substrate to form a thin film thereon. After being dried, the film on the surface is fired under a magnetic field in an oxidizing atmosphere to provide a supercoducting thin film. Furthermore, it also effective to apply a magnetic field to a thin film which is being formed by sputtering or spraying. Still further, superconducting films can be formed by ion plating or plasma melting spray method, in which magnetic field is applied thereto during film formation. Anyway, during formation of superconducting ceramics, the well-ordered structure is enhanced if the material which is just being formed into a film is heated, e.g. at 100–900° C.

In this description, the term "superconducting" is used to direct the property of material that superconductivity arise when the temperature is below the Tc. Also, Group IIIa is directed to a group consisting of transition elements as shown in "Physics and Chemistry Dictionary" published by Iwanami, Japan. In this connection, Group IIIa consists of typical elements in "The Penguin Dictionary of Science" published by Penguin Books.

What is claimed is:

1. A method of manufacturing a superconducting ceramic material, said method including a step of forming a superconducting material from a mixture prepared in accordance with the stoichiometric formulae of $(A_{1-x}B_x)_yCu_zO_w$, where A is one or more elements selected from Group IIIa of the Periodic Table, B is one or more elements selected from Group IIa of the Periodic Table, and x=0–1, y+2–4, z=1–4 and w=4–10, said mixture being heated in an oxidizing atmosphere at 500° C. to 1200° C. during said forming step under application of a magnetic field having a strength not lower than 500 Gauss such that a crystalline structure of the material is oriented in accordance with the applied magnetic field.

2. A method of manufacturing a superconducting ceramic material, said method including a step of forming a superconducting material from a mixture prepared in accordance with the stoichiometric formulae of $(A_{1-x}B_x)_yCu_zO_w$, where A is one or more elements selected from Group Vb of the Periodic Table such as Bi, Sb and As, B is one or more elements selected from Group IIa of the Periodic Table, and x=0.3–1; y=2.0–4.0, z=1.0–4.0 and w=4.0–10.0, said mixture being heated in an oxidizing atmosphere at 500° to 1200° C. during said forming step under application of a magnetic field having a strength not lower than 500 Gauss such that a crystalline structure of the material is oriented in accordance with the applied magnetic field.

3. The method of claim 1 or claim 2 wherein said forming step comprising mixing together the powdered chemical constituents of the desired superconducting ceramic material and consolidating the mixture in a superconducting material.

4. The method of claim 1 or claim 2 wherein said mixture is heated at 100–900° C.

5. The method of claim 1 or claim 2 wherein said mixture is compressed during the heating under the application of magnetic field.

6. The method of claim 1 or claim 2 wherein the strength of said magnetic field is not lower than 500–10000 Gauss.

7. The method of claim 1 or claim 2 wherein the magnetic field is applied to said mixture in the same direction as that in which the superconducting material is required to pass electric current.

8. The method of claim 1 or claim 2 wherein said forming step comprising compacting the mixture and firing the compact mixture.

9. The method of claim 1 or claim 2 wherein said forming step comprising making the mixture fluid with a solvent, applying the fluid mixture to a surface and firing the mixture on the surface.

10. The method of claim 8 further comprising pre-firing said mixture and grinding the pre-fired mixture into fine powder, prior to the final compacting and firing of the mixture.

11. The method of claim 8 wherein said mixture is compressed into a tablet form before said pre-firing step.

12. The method of claim 10 wherein said pre-firing is carried out in an oxidizing atmosphere.

13. The method of claim 10 wherein the average grain diameter of the ground mixture is 200–3 microns.

14. The method of claim 13 wherein the average grain diameter of the ground mixture is 10 microns or smaller.

15. The method of claim 7 wherein the sense of said magnetic field is constant.

16. The method of claim 7 wherein the sense of said magnetic field is alternating.

17. The method of claim 16 wherein the frequency of said alternating magnetic field is a commertial frequency.

18. The method of claim 1 wherein the factor y is within the range of 2.5 to 3.5.

19. The method of claim 1 wherein the factor z is within the range of 1.5 to 3.5.

20. The method of claim 1 wherein the factor w is within the range of 6.0 to 8.0.

21. The method of claim 1 wherein said mixture is prepared in accordance with the stoichiometric formulae $YBa_2Cu_3O_{6-9}$.

22. The method of claim 2 where in the factor y is within the range of 2.5 to 3.5.

23. The method of claim 2 wherein the factor z is within the range of 1.5 to 3.5.

24. The method of claim 2 wherein the factor w is within the range of 6.0 to 8.0.

25. The method of claim 2, wherein said mixture is prepared in accordance with the stoichiometric formulae $BiCaSrCu_3O_{6-8}$.

26. A method of manufacturing a superconducting ceramic material, said method including a step of forming a superconducting material from a mixture including a plurality of metals including at least one lanthanide and an oxygen constituent, heating said superconducting material in an oxidizing atmosphere at 500° to 1200° C. wherein a magnetic field is applied to said superconducting material during the heating step such that a crystalline structure of said material is oriented in accordance with the applied magnetic field.

27. A method of manufacturing a superconducting ceramic material, said method including a step of forming a superconducting material from a mixture including a plurality of metals including at least one lanthanide and an oxygen constituent, heating said superconducting material in an oxidizing atmosphere at 500° to 120° C. under an application of a magnetic field in a direction normal to an a-b plane of said material such that a crystalline structure of said material is oriented in accordance with the applied magnetic field.

28. A method of manufacturing a superconducting ceramic material, said method including the step of forming a superconducting material from a mixture including a plurality of metals including at least one lanthanide and an oxygen constituent, heating said superconducting material in an oxidizing atmosphere at 500° to 1200° C. under application of a magnetic field, wherein said ceramic material is compressed during the heating step.

29. A method of making a high-$T_c$ superconductor comprising the steps of providing particles including a plurality of metals including at least one lanthanide and an oxygen constituent in admixture with one another as the constituent s of said superconductor and sintering said constituents in an oxidizing atmosphere at 500° to 1200° C., wherein the improvement comprises the step of applying a magnetic field to said particles during said sintering step, said magnetic field being effective to substantially align said particles in said sintering step.

30. A method as claimed in claim 29 wherein said high-$T_c$ superconductor is a bulk superconductor.

31. A method as claimed in claim 29, wherein said magnetic field has a field strength of at least about 500 Gauss.

32. A method as claimed in claim 31, wherein said magnetic field has a field strength of at least about 100,000 Gauss.

33. A method as claimed in claim 29, wherein said particles have a mean particle size of 0.03–200 microns.

34. A method as claimed in claim 33, wherein said particles have a mean particle size of 10 microns or smaller.

35. A method as claimed in claim 29 wherein said plurality of metals includes a first metal component including said lanthanide or another element of Group 3A.

36. A method as claimed in claim 35 wherein said metals in said particles include Cu and a Group 2A metal.

37. A method as claimed in claim 36 wherein said first metal component, Group 2A metal, and copper are present at a molar ratio of about 1:2:3.

38. A method as claimed in claim 29 further comprising the step of adjusting the oxygen content of said particles during said sintering step.

39. A method as claimed in claim 37 wherein said step of providing said particles includes the steps of providing said metals as substantially pure compounds of the individual metals in particulate form, mixing said particulate, substantially pure compounds, preliminary sintering said mixed, pure compounds to thereby intimately mix said pure compounds with one another by diffusion, and pulverizing said intimately mixed compounds.

40. A method as claimed in claim 39 wherein said step of forming said mixed compounds further includes the step of mixing and resintering said pulverized intimately mixed compounds and pulverizing the product of said resintering step.

41. A method as claimed in claim 29 further comprising the step of applying a magnetic field during the step of providing particles.

42. A method as in claim 30 where said superconductor is a magnetically anisotropic, high-temperature superconductor, where said at least one lanthanide is magnetically susceptible and where said particles are magnetically anisotropic and magnetically susceptible during said sintering step.

43. A method of manufacturing a superconducting ceramic material mixture prepared in accordance with the stoichiometric formula of $(A_{1-x}B_x)_yCu_zO_w$, where A is one or more elements selected from Group IIIa of the Periodic Table, B is one or more elements selected from Group IIa of the Periodic Table, and x=0–1, y=2.0–4.0, z=1.0–4.0 and w=4.0–10.0, said mixture being consolidated by a pressing and firing step, wherein the improvement comprises the step of applying a magnetic field to the mixture during said pressing and firing step such that the atomic arrangement is ordered.

44. A method of making a high-$T_c$ superconductor comprising the steps of providing particles including a plurality of metals including at least one lathanide and an oxygen constituent in admixture with one another as the constituents of said superconductor and consolidating said constituents by compacting said particles and sintering said compacted particles, wherein the improvement comprises the step of applying a magnetic field to said particles during said consolidating step, said magnetic field being effective to substantially align said particles in said consolidating step.

45. A method as claimed in claim 44, wherein said high-$T_c$ superconductor is a bulk superconductor.

46. A method as claimed in claim 44, wherein said magnetic field has a field strength of at least about 500 Gauss.

47. A method as claimed in claim 46, wherein said magnetic field has a field strength of at least about 100,000 Gauss.

48. A method as claimed in claim 44, wherein said particles have a mean particle size of 0.03–200 microns.

49. A method as claimed in claim 48, wherein said particles have a mean particle size of 10 microns or smaller.

50. A method as claimed in claim 44, wherein said plurality of metals includes a first metal component including said lathanide or another element of Group 3A.

51. A method as claimed in claim 50, wherein said metals in said particles include Cu and a Group 2A metal.

52. A method as claimed in claim 51 wherein said first metal component, Group 2A metal and copper are present at a molar ratio of about 1:2:3.

53. A method as claimed in claim 44 further comprising the step of adjusting the oxygen content of said particles during said sintering step.

54. A method as claimed in claim 53 wherein said step of providing said particles includes the steps of providing said metals as substantially pure compounds of the individual metals in particulate form, mixing said particulate, substantially pure compounds, preliminary sintering said mixed, pure compounds to thereby intimately mix said pure compounds with one another by diffusion, and pulverizing said intimately mixed compounds.

55. A method as claimed in claim 54 wherein said step of forming said mixed compounds further includes the step of mixing and resintering said pulverized intimately mixed compounds and pulverizing the product of said resintering step.

56. A method as claimed in claim 44 further comprising the step of applying a magnetic field during the step of providing particles.

57. A method as in claim 45 where said superconductor is a magnetically anisotropic, high-temperature superconductor, where said at least one lanthanide is magnetically susceptible and where said particles are magnetically anisotropic and magnetically susceptible during said consolidating step.

* * * * *